United States Patent
Tada

(10) Patent No.: US 10,971,547 B2
(45) Date of Patent: Apr. 6, 2021

(54) SWITCH ELEMENT, SWITCHING METHOD AND SEMICONDUCTOR DEVICE

(71) Applicant: NanoBridge Semiconductor, Inc., Tsukuba (JP)

(72) Inventor: Munehiro Tada, Tokyo (JP)

(73) Assignee: NANOBRIDGE SEMICONDUCTOR, INC., Tsukuba (JP)

(*) Notice: Subject to any disclaimer, the term of this patent is extended or adjusted under 35 U.S.C. 154(b) by 0 days.

(21) Appl. No.: 16/628,099

(22) PCT Filed: Jul. 3, 2018

(86) PCT No.: PCT/JP2018/025228
§ 371 (c)(1),
(2) Date: Jan. 2, 2020

(87) PCT Pub. No.: WO2019/009296
PCT Pub. Date: Jan. 10, 2019

(65) Prior Publication Data
US 2020/0127051 A1    Apr. 23, 2020

(30) Foreign Application Priority Data
Jul. 6, 2017    (JP) .............................. JP2017-133083

(51) Int. Cl.
*H01L 27/24*    (2006.01)
*H01L 45/00*    (2006.01)

(52) U.S. Cl.
CPC ........ *H01L 27/2436* (2013.01); *H01L 45/085* (2013.01); *H01L 45/1266* (2013.01)

(58) Field of Classification Search
None
See application file for complete search history.

(56) References Cited

U.S. PATENT DOCUMENTS

2005/0045919 A1    3/2005    Kaeriyama et al.
2009/0279344 A1    11/2009   Toda
(Continued)

FOREIGN PATENT DOCUMENTS

JP    2005-101535 A    4/2005
JP    2008-227267 A    9/2008
(Continued)

OTHER PUBLICATIONS

International Search Report for PCT Application No. PCT/JP2018/025228, dated Sep. 11, 2018.
(Continued)

*Primary Examiner* — J. E. Schoenholtz
(74) *Attorney, Agent, or Firm* — Dority & Maiming. P.A.

(57) ABSTRACT

This switch element includes a resistance change element, a first transistor, and a second transistor. The resistance change element includes: a metal deposition type resistance change film; a first electrode; and a second electrode. To the second electrode, a source or a drain of the second transistor is connected. The switch element has a first mode and a second mode, when a potential of the second electrode is made higher than that of the first electrode and the resistance change element is switched from the low resistance state to the high resistance state. The gate voltage is greater in the first mode than in the second mode, and a potential difference between the first and second electrodes is smaller in the first mode than in the second mode.

20 Claims, 13 Drawing Sheets

(56) References Cited

U.S. PATENT DOCUMENTS

| | | |
|---|---|---|
| 2010/0235714 A1 | 9/2010 | Toda |
| 2015/0103583 A1 | 4/2015 | Tada et al. |
| 2017/0249986 A1* | 8/2017 | Buchanan ............ G11C 13/003 |
| 2018/0262197 A1* | 9/2018 | Gaillardon .......... H01L 45/1206 |

FOREIGN PATENT DOCUMENTS

| | | |
|---|---|---|
| JP | 2009-271999 A | 11/2009 |
| JP | 2010-218599 A | 9/2010 |
| JP | 2013-048004 A | 3/2013 |
| JP | 2015-185771 A | 10/2015 |
| WO | 2013/136798 A1 | 9/2013 |

OTHER PUBLICATIONS

English translation of Written opinion for PCT Application No. PCT/JP2018/025228.

S. Kaeriyama et al., "A Nonvolatile Programmable Solid-Electrolyte Nanometer Switch", IEEE Journal of Solid-State Circuits, vol. 40, No. 1, Jan. 2005, pp. 168 to 176, Japan.

\* cited by examiner

Fig.3

| RESISTANCE STATE | APPLIED VOLTAGE | |
|---|---|---|
| | FIRST ELECTRODE | SECOND ELECTRODE |
| HIGH RESISTANCE → LOW RESISTANCE | HIGH | LOW |
| LOW RESISTANCE → HIGH RESISTANCE | LOW | HIGH |

Fig.4A

| MODE | Vpl | Vgpl | Vbl | Vgbl |
|---|---|---|---|---|
| CURRENT MODE | GND | Vgpl-1 (HIGH AT POSITIVE) | Vbl-1 (LOW AT POSITIVE) | SWITCH ON TRANSISTOR |
| VOLTAGE MODE | GND | Vgpl-2 (LOW AT POSITIVE) | Vbl-2 (HIGH AT POSITIVE) | SWITCH ON TRANSISTOR |

Fig.4B

| MODE | Vpl | Vgpl | Vbl | Vgbl |
|---|---|---|---|---|
| CURRENT MODE | Vpl-1 (LOW AT NEGATIVE) | SWITCH ON TRANSISTOR | GND | Vgbl-1 (HIGH AT POSITIVE) |
| VOLTAGE MODE | Vpl-2 (HIGH AT NEGATIVE) | SWITCH ON TRANSISTOR | GND | Vgbl-2 (LOW AT POSITIVE) |

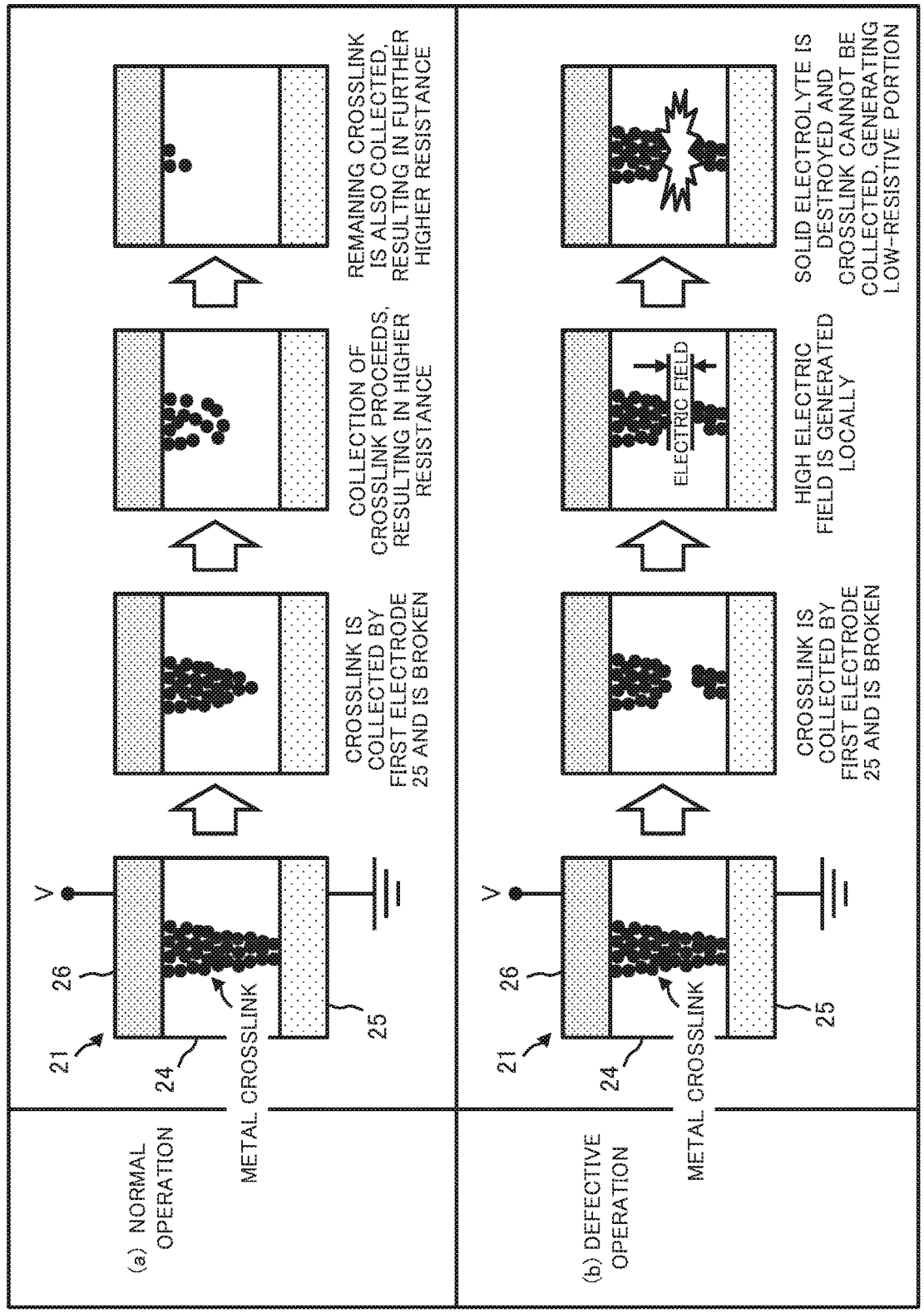

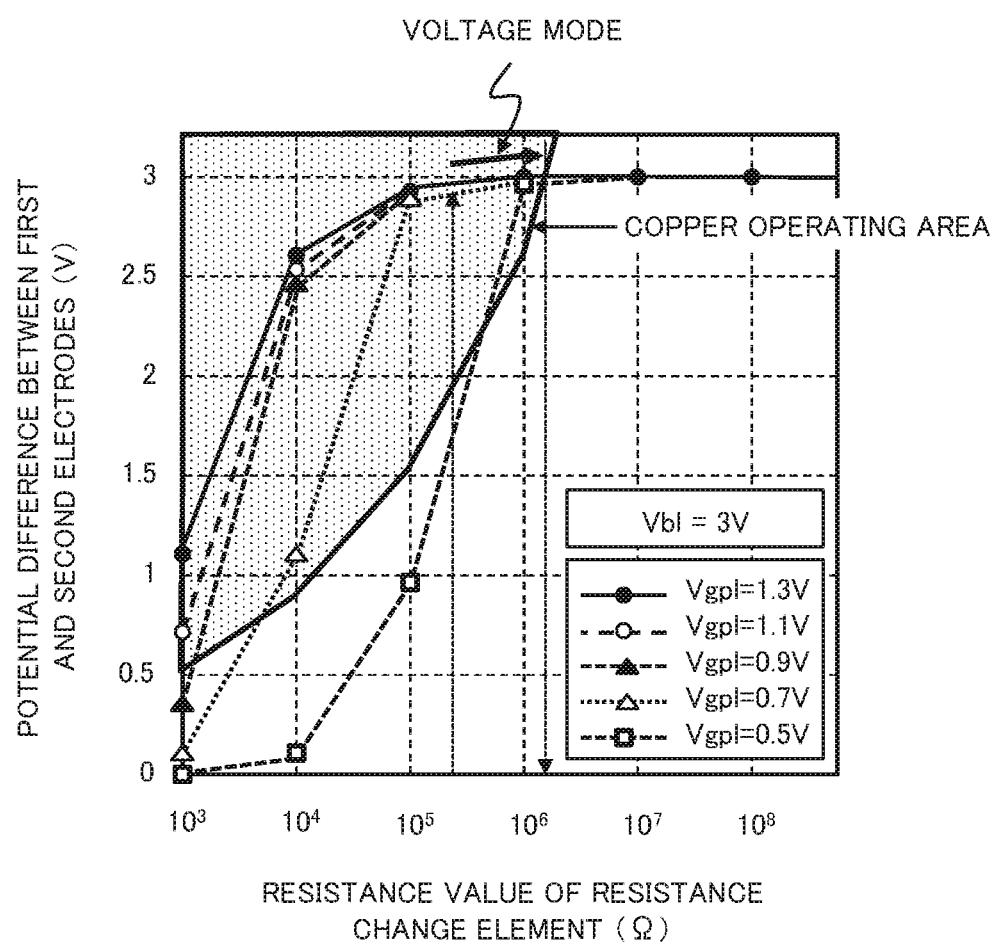

SWITCH ELEMENT, SWITCHING METHOD AND SEMICONDUCTOR DEVICE

This application is a National Stage Entry of PCT/JP2018/025228 filed on Jul. 3, 2018, which claims priority from Japanese Patent Application 2017-133083 filed on Jul. 6, 2017, the contents of all of which are incorporated herein by reference, in their entirety.

TECHNICAL FIELD

The present invention relates to a switch element, a switching method, and a semiconductor device.

BACKGROUND ART

A semiconductor integrated circuit being a semiconductor device includes transistors formed in a semiconductor substrate and an interconnect layer formed in an upper layer of the semiconductor substrate in order to connect the transistors. A configuration of the transistors and the interconnect is determined at a design stage of the integrated circuit, and it is difficult to change a connection between the transistors after manufacturing the semiconductor integrated circuit. On the other hand, a programmable logic integrated circuit that can be reconfigured such as a field programmable gate array (FPGA) stores configuration information on an operation of a logic operation circuit and a connection of a logic operation circuit into a memory, and thereby enabling a change in a logic operation and an interconnect connection.

As a memory element for storing the configuration information, a static random access memory (SRAM) cell, an anti-fuse, a floating gate metal oxide semiconductor (MOS) transistor, and the like are used. However, these memory elements are formed in the same layer as the transistor, and thus an area of the semiconductor integrated circuit becomes large by an area of the memory element, resulting in an increase in manufacturing cost. Further, since a ratio of the logic operation circuit to the area of the semiconductor integrated circuit is decreased by the area of the memory element, a power performance ratio is lowered due to a decrease in an operation speed and an increase in an operating power of the circuit.

PTL 1 and NPL 1 disclose a programmable logic integrated circuit capable of changing an interconnect connection after manufacturing a semiconductor integrated circuit by a resistance change element formed in an interconnect layer. This enables correction of a defect and change of a specification of the circuit after being manufactured, reduction of an area and improvement of a power performance ratio of the semiconductor integrated circuit, and, in addition, omission of an operation of reading circuit configuration information on start-up.

The resistance change element in PTL 1 and NPL 1 includes a solid electrolyte in which an ion can freely move by an electric field or the like, and a first electrode and a second electrode that face each other across the solid electrolyte. The solid electrolyte is supplied with a metal ion from the first electrode, and not from the second electrode. The metal ion is deposited as a metal by movement and electrochemical reaction in the solid electrolyte. The deposited metal becomes a metal crosslink (also referred to as a filament or a conductive path) connecting the first electrode and the second electrode, and therefore the resistance change element becomes a low-resistive state (ON). Further, when this metal crosslink disappears, the resistance change element becomes a high-resistive state (OFF).

FIG. 10 is a diagram illustrating an operation of the resistance change element having a bipolar characteristic. First, in a set operation (a) in which transition from the high-resistive state to the low-resistive state is performed, when the second electrode is grounded and a positive voltage is applied to the first electrode, a metal of the first electrode becomes a metal ion and is dissolved into the solid electrolyte. The metal ion is deposited as a metal by movement and electrochemical reaction in the solid electrolyte, and a metal crosslink connecting the first electrode and the second electrode is formed by the deposited metal at a set voltage. The first electrode and the second electrode are electrically connected by the metal crosslink, thereby the resistance change element turns ON. In this low-resistive state being ON, when the second electrode is grounded and a positive voltage is applied to the first electrode, the resistance change element maintains the low-resistive state, and exhibits an ohmic current-voltage characteristic (low-resistive operation (b)).

On the other hand, in a reset operation (c) in which transition from the low-resistive state being ON to the high-resistive state being OFF is performed, when the second electrode is grounded and a negative voltage is applied to the first electrode, a part of the metal crosslink becomes a metal ion and is dissolved into the solid electrolyte, and therefore the metal crosslink is broken. As a result, the electrical connection between the first electrode and the second electrode is cut off and the resistance change element turns OFF. Note that a change in electrical characteristics such as increase of resistance between the electrodes or capacitance change occurs from a stage before the electrical connection is completely cut off, and the electrical connection is finally cut off at a reset voltage. In order to change from the high-resistive state being OFF to the low-resistive state being ON, the second electrode has only to be grounded again and a positive voltage has only to be applied to the first electrode (re-set operation (d)).

The switch using the above resistance change element is smaller than a semiconductor switch such as the MOS transistor described above, and has a smaller resistance value (referred to as ON-resistance) in the ON state. Further, the resistance change element is formed in the interconnect layer. For this reason, the area of the semiconductor integrated circuit can be reduced and the power performance ratio can be improved. In addition, the resistance change element has non-volatility that maintains ON and OFF states without applying voltage, and therefore the operation of reading circuit configuration information on start-up is not necessary. From the above features, the switch using the resistance change element is advantageous for applying to a programmable logic integrated circuit. Further, the resistance change element can also be used as a non-volatile memory due to the non-volatility.

PTL 2 further discloses a technique for reducing a set/reset voltage and variation thereof by devising a shape of the first electrode that supplies a metal ion in such a way that the electric field can be easily concentrated.

CITATION LIST

Patent Literature

[PTL 1] Japanese Unexamined Patent Application Publication No. 2005-101535
[PTL 2] International Publication No. WO2013/136798

Non Patent Literature

[NPL 1] S. Kaeriyama et al., "A Nonvolatile Programmable Solid-Electrolyte Nanometer Switch", IEEE Journal of Solid-State Circuits, Vol. 40(1), pp. 168 to 176, (2005).

SUMMARY OF INVENTION

Technical Problem

However, with regard to the resistance change element, in the reset operation in which transition from the low-resistive state being ON to the high-resistive state being OFF is performed, a defective operation may occur in which the low-resistive state occurs in spite of applying a voltage for reset. FIG. 11 is a diagram illustrating (a) a normal operation and (b) a defective operation in the reset operation of the resistance change element. In the normal operation, when the second electrode is grounded and a negative voltage is applied to the first electrode, the resistance change element becomes the high-resistive state being OFF at the reset voltage. On the other hand, in the defective operation, although the resistance value increases once with increase of the negative voltage, the resistance change element finally returns to the low-resistive state being ON, resulting in a reset failure.

This defective operation does not work normally even when the same reset operation is performed again. For this reason, when the resistance change element is used as a switch, an erroneous connection resulting from the defective operation may cause a problem such as malfunction and an increase in standby power due to a leakage current. Further, when the resistance change element is used as a memory, a measure with an error correction code (ECC) having high defect relief rate or redundancy is required, resulting in an increase in cost. PTLs 1 and 2 and NPL 1 disclose no solution for the defective operation.

The present invention has been made in view of the above issues, and an object thereof is to provide a switch element using a metal crosslink-type resistance change element in which transition from a low-resistive state to a high-resistive state is stabilized.

Solution to Problem

The switch element of the present invention includes a resistance change element, a first transistor, and a second transistor. The resistance change element includes: a metal deposition type resistance change film; a first electrode which is connected to one surface of the resistance change film and supplies metal ions to the resistance change film; and a second electrode which is connected to the other surface of the resistance change film. To the first electrode, a drain or a source of the first transistor is connected. To the second electrode, a source or a drain of the second transistor is connected. The switch element has a first mode and a second mode, when a potential of the second electrode is made higher than that of the first electrode and the resistance change element is switched from the low resistance state to the high resistance state. The gate voltage is greater in the first mode than in the second mode, and a potential difference between the first and second electrodes is smaller in the first mode than in the second mode.

The semiconductor device of the present invention includes a semiconductor integrated circuit having the switch element of the present invention, The switching method of the present invention is applied to a switch element which has a resistance change element, a first transistor, and a second transistor. The resistance change element includes a metal deposition type resistance change film, a first electrode that is connected to one surface of the resistance change film and supplies a metal ion to the resistance change film, and a second electrode that is connected to another surface of the resistance change film. The first transistor of which a drain or a source is connected to the first electrode. The second transistor of which a source or a drain is connected to the second electrode. The switching method includes a first mode and a second mode when the resistance change element switches from a low-resistive state to a high-resistive state. Here, a first mode in which a gate voltage of the first transistor or the second transistor is defined as a first gate voltage, and a potential difference between the first electrode and the second electrode is defined as a first potential difference. In addition, a second mode in which a gate voltage of the first transistor or the second transistor is defined as a second gate voltage, and a potential difference between the first electrode and the second electrode is defined as a second potential difference. At this time, the first gate voltage is set larger than the second gate voltage and the first potential difference is set smaller than the second potential difference.

Advantageous Effects of Invention

The present invention provides a switch element using a metal crosslink-type resistance change element in which transition from a low-resistive state to a high-resistive state is stabilized.

BRIEF DESCRIPTION OF DRAWINGS

FIG. 3 is a diagram illustrating an operation of a resistance change element of the switch element according to the second example embodiment of the present invention.

FIG. 4A is a diagram illustrating an operation of the switch element according to the second example embodiment of the present invention.

FIG. 4B is another diagram illustrating an operation of the switch element according to the second example embodiment of the present invention.

FIG. 5 is a diagram illustrating a normal operation and a defective operation of transition from a high-resistive state to a low-resistive state of the resistance change element.

FIG. 6B is a diagram illustrating transition from a low-resistive state to a high-resistive state in a voltage mode of the switch element according to the second example embodiment of the present invention.

EXAMPLE EMBODIMENT

In the following, example embodiments of the present invention are described in detail with reference to the drawings. The below-described example embodiments include technically preferred limitations for implementing the present invention. The scope of the invention, however, is not limited to the following.

First Example Embodiment

Figure 1:
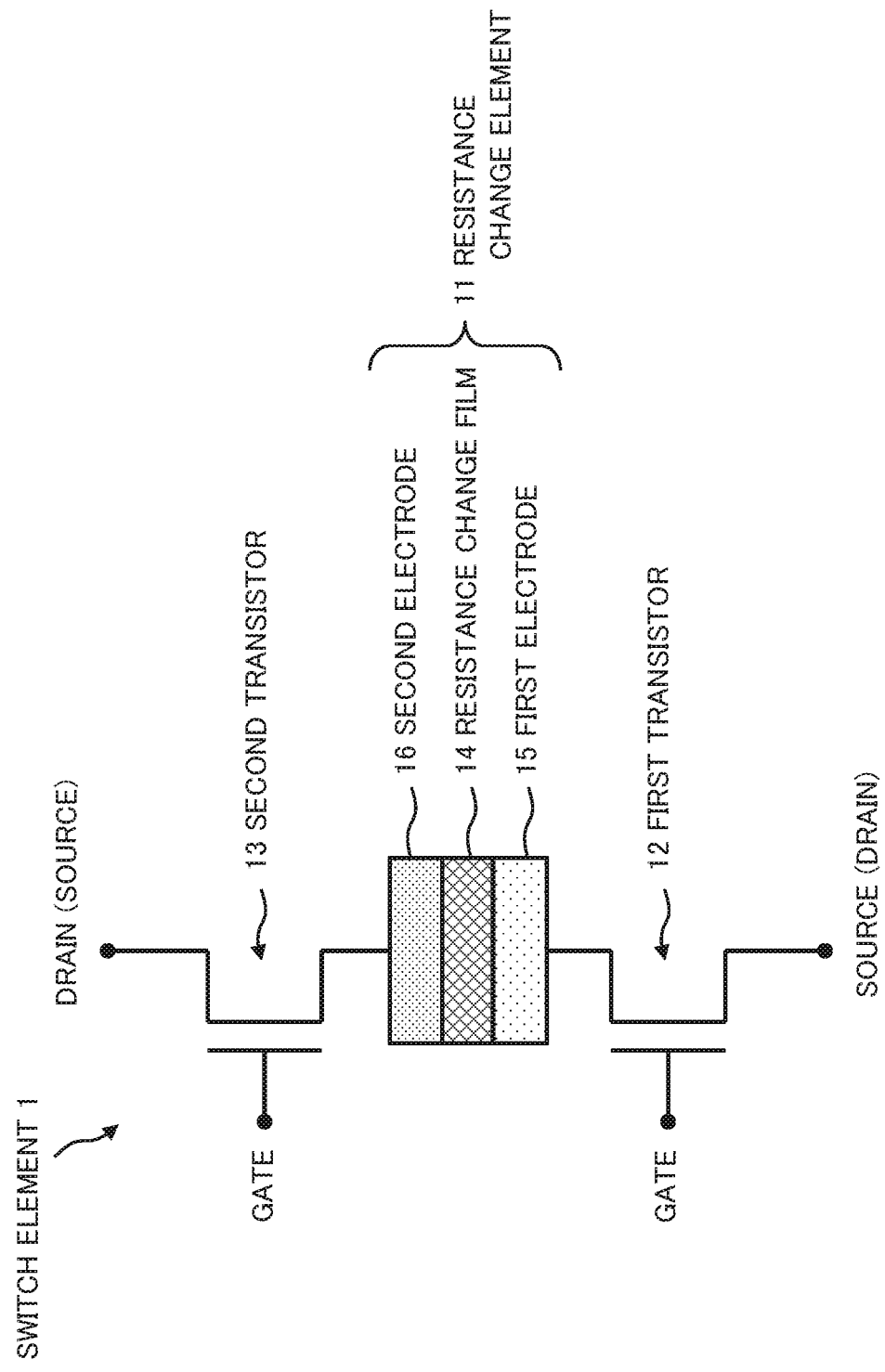
FIG. 1 is a diagram illustrating a configuration of a switch element according to a first example embodiment of the present invention.

FIG. 1 is a diagram illustrating a configuration of a switch element according to a first example embodiment of the present invention. A switch element 1 according to the present example embodiment includes a resistance change element 11, a first transistor 12, and a second transistor 13. The resistance change element 11 includes a metal deposition type resistance change film 14, a first electrode 15 that is connected to one surface of the resistance change film 14 and supplies a metal ion to the resistance change film 14, and a second electrode 16 that is connected to another surface of the resistance change film 14. To the first electrode 15, a drain or a source of the first transistor 12 is connected. To the second electrode 16, a source or a drain of the second transistor 13 is connected.

In the switch element 1, the first transistor 12 and the second transistor 13 make a potential of the second electrode 16 higher than a potential of the first electrode 15, and switch the resistance change element 11 from a low-resistive state to a high-resistive state. The switch operation for changing the resistance change element 11 from the low-resistive state to the high-resistive state has a first mode and a second mode. Herein, a gate voltage of the first transistor 12 or the second transistor 13 in the first mode is defined as a first gate voltage, and a potential difference between the first electrode 15 and the second electrode 16 is defined as a first potential difference. Further, a gate voltage of the first transistor 12 or the second transistor 13 in the second mode is defined as a second gate voltage, and a potential difference between the first electrode and the second electrode is defined as a second potential difference. At this time, the first gate voltage is set larger than the second gate voltage, and the first potential difference is set smaller than the second potential difference.

According to the switch element 1, a current limit and a voltage limit are executed in a reset operation by combining the first mode and the second mode, and thereby the destruction of the resistance change film 14 caused by large current flowing at high voltage can be suppressed. Therefore, the occurrence of a defective operation in which the low-resistive state occurs in spite of applying a voltage for reset can be suppressed.

As described above, the present example embodiment is able to provide a switch element using a metal crosslink-type resistance change element in which transition from a low-resistive state to a high-resistive state is stabilized.

Second Example Embodiment

Figure 2:
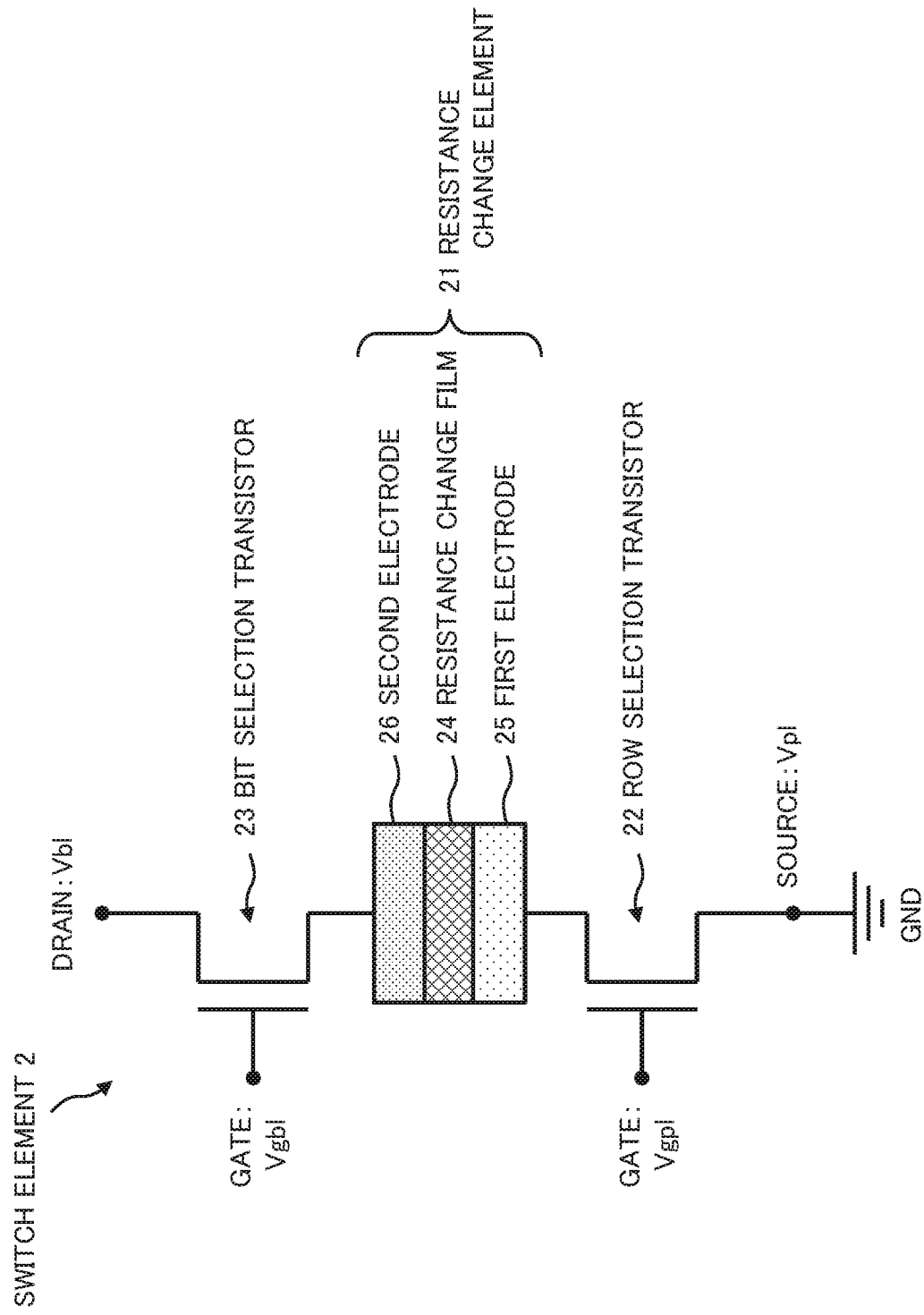
FIG. 2 is a diagram illustrating a configuration of a switch element according to a second example embodiment of the present invention.

FIG. 2 is a diagram illustrating a configuration of a switch element according to a second example embodiment of the present invention. A switch element 2 according to the present example embodiment includes a resistance change element 21, a row selection transistor 22, and a bit selection transistor 23.

The resistance change element 21 includes a metal deposition type resistance change film 24, a first electrode 25 that is connected to one surface of the resistance change film 24 and supplies a metal ion to the resistance change film 24, and a second electrode 26 that is connected to another surface of the resistance change film 24. The first electrode 25 is also referred to as an active electrode, and the second electrode 26 is also referred to as an inert electrode.

A drain of the row selection transistor 22 is connected to the first electrode 25 of the resistance change element 21. A source of the row selection transistor 22 may also be connected to the first electrode 25. A source of the bit selection transistor 23 is connected to the second electrode 26 of the resistance change element 21. A drain of the bit selection transistor 23 may also be connected to the second electrode 26.

FIG. 3 is a diagram illustrating an operation of the resistance change element 21. When the resistance change element 21 is switched from a high-resistive state (OFF) to a low-resistive state (ON), the potential of the first electrode 25 is set higher than the potential of the second electrode 26. Further, when the resistance change element 21 is switched from the low-resistive state to the high-resistive state, the potential of the second electrode 26 is set higher than the potential of the first electrode 25.

The row selection transistor 22 and the bit selection transistor 23 make, when the resistance change element 21 is switched from the low-resistive state to the high-resistive state, the potential of the second electrode 26 higher than the potential of the first electrode 25. Further, at this time, the row selection transistor 22 and the bit selection transistor 23 have a current mode and a voltage mode, and switch from the low-resistive state to the high-resistive state.

FIGS. 4A and 4B are diagrams illustrating the operation of switching the switch element 2 from the low-resistive state to the high-resistive state having the current mode and the voltage mode.

In FIG. 4A, the source of the row selection transistor 22 is grounded (GND) as illustrated in FIG. 2. Further, a voltage Vgb1 that switches ON the bit selection transistor 23 is applied to a gate of the bit selection transistor 23. In the current mode, a positive voltage Vgp1-1 is applied to a gate of the row selection transistor 22, and a positive voltage Vb1-1 is applied to the drain of the bit selection transistor 23. Further, in the voltage mode, a positive voltage Vgp1-2 is applied to the gate of the row selection transistor 22, and a positive voltage Vb1-2 is applied to the drain of the bit selection transistor 23. At this time, it is assumed that a relation of Vgp1-1>Vgp1-2, Vb1-1<Vb1-2 holds.

In FIG. 4B, the drain of the bit selection transistor 23 is grounded (GND) unlike FIG. 2. Further, a voltage Vgp1 that switches ON the row selection transistor 22 is applied to the gate of the row selection transistor 22. In the current mode, a positive voltage Vgb1-1 is applied to the gate of the bit selection transistor 23, and a negative voltage Vp1-1 is applied to the source of the row selection transistor 22. Further, in the voltage mode, a positive voltage Vgb1-2 is applied to the gate of the bit selection transistor 23, and a negative voltage Vp1-2 is applied to the source of the row selection transistor 22. At this time, it is assumed that a relation of Vgb1-1>Vgb1-2, |Vp1-1|<|Vp1-2| holds.

When the switch element 2 is switched from the low-resistive state to the high-resistive state having the current mode and the voltage mode, it is preferable to start the switch from the current mode. In addition, the current mode and the voltage mode can be alternately repeated a plurality of times. Further, each time the current mode and the voltage mode are alternately repeated, each gate voltage and the voltage between the first electrode 25 and the second electrode 26 may be increased. Further, a resistance value of the resistance change element 21 may be monitored between the current mode and the voltage mode.

Figure 11:
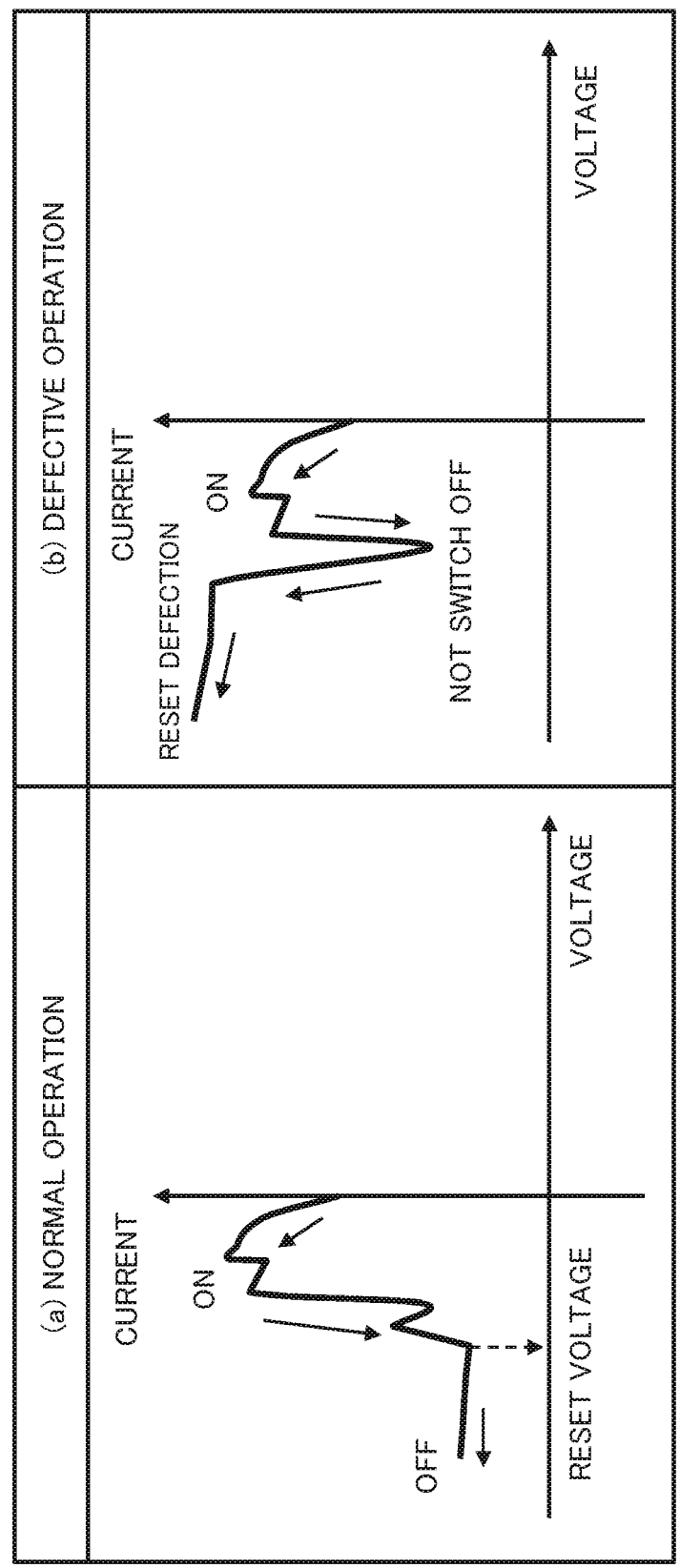
FIG. 11 is a diagram illustrating a normal operation and a defective operation in a reset operation by the known resistance change element.

FIG. 5 is a diagram illustrating (a) a normal operation and (b) a defective operation of the transition of the resistance change element 21 from the low-resistive state to the high-resistive state as illustrated in FIG. 11. A mechanism of the defective operation in FIG. 5 is a result of diligent investigation and consideration by the inventor.

First, in the normal operation, the resistance change element 21 is in a low-resistive state due to a metal crosslink. At this time, when the first electrode 25 is grounded and a positive voltage is applied to the second electrode 26, metal of the metal crosslink becomes a metal ion and is dissolved into the resistance change film 24, and therefore a part of the metal crosslink is broken. The metal dissolved into the resistance change film 24 is collected by the first electrode 25. As a result, the electrical connection between the first electrode 25 and the second electrode 26 is cut off, and the collection of the metal crosslink further proceeds, resulting in a high-resistive state. Note that the same also applies to a case where the second electrode 26 is grounded and a negative voltage is applied to the first electrode 25.

On the other hand, in the defective operation, when the metal of the metal crosslink becomes a metal ion and is dissolved into the resistance change film 24, and a part of the metal crosslink is broken, the metal of the metal crosslink locally remains. A high electric field is generated at a portion where the metal of the metal crosslink locally remains. A large current flows through this local high electric field and thus the solid electrolyte is destroyed and the metal crosslink cannot be collected. At the same time, a low-resistive portion is generated and the resistance change element 21 falls into a low-resistive state. This is consistent with a fact that, when the resistance change element 21 falls into a low-resistive state during the reset operation, the state does not return to be normal even though the same reset operation is performed again. Note that the same also applies to a case where the second electrode 26 is grounded and a negative voltage is applied to the first electrode 25.

Based on the mechanism of the defective operation described above, in order to suppress the generation of a low-resistive portion during the reset operation, it is effective to suppress the destruction of the solid electrolyte caused by large current flowing through the high electric field, by combining a current limit and a voltage limit in the reset operation.

Figure 6A:
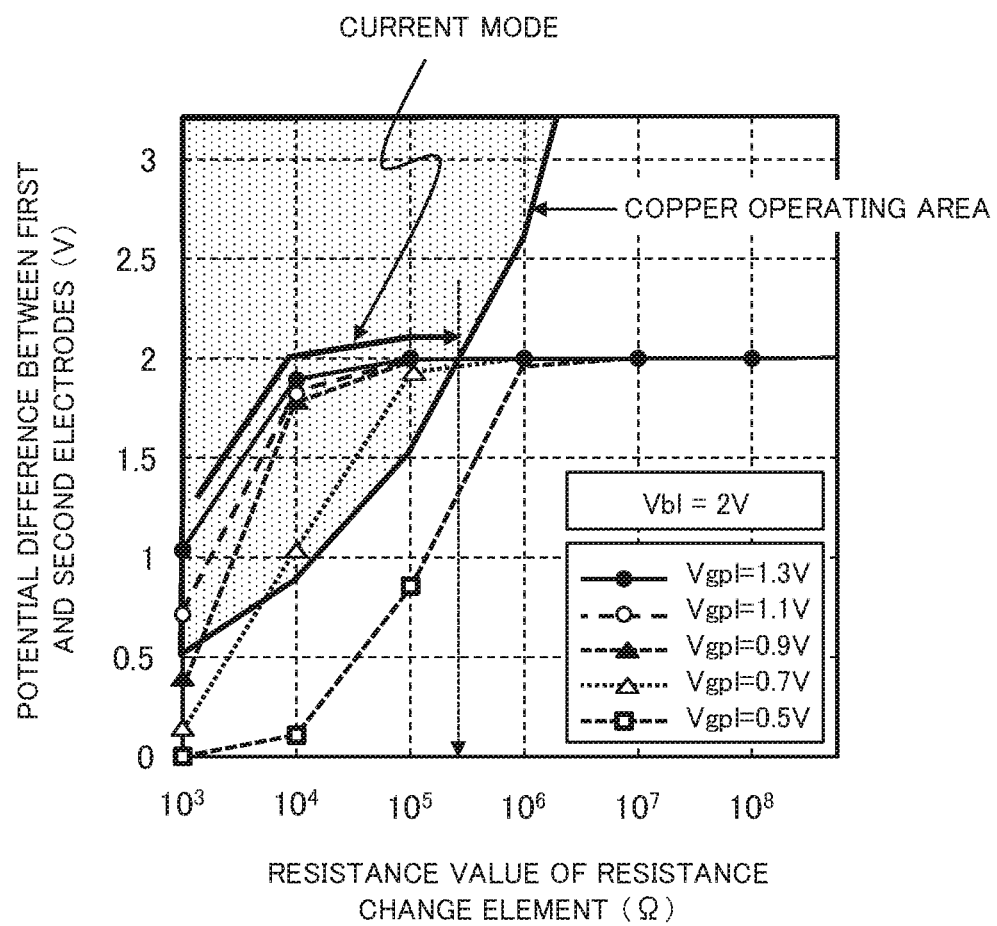
FIG. 6A is a diagram illustrating transition from a low-resistive state to a high-resistive state in a current mode of the switch element according to the second example embodiment of the present invention.

FIGS. 6A and 6B each are the diagrams illustrating the reset operation of the switch element 2 from the low-resistive state to the high-resistive state in the current mode and the voltage mode, respectively.

FIGS. 6A and 6B are associated with the condition of FIG. 4A, the drain voltage Vb1 of the bit selection transistor 23 is set to 2V and 3V respectively, and the gate voltage Vgp1 of the row selection transistor 22 is used as a parameter. FIGS. 6A and 6B indicate a result estimated by a simulation program with integrated circuit emphasis (SPICE) with regard to the relation between the potential difference between the first electrode 25 and the second electrodes 26 of the resistance change element 21 and the resistance value of the resistance change element 21 at this time.

In addition, a copper operating area of FIGS. 6A and 6B indicates, when the first electrode 25 is copper, the area of a voltage required for copper to move in the resistance change element 21, calculated based on an experiment. Within this area, ionization of copper being the metal crosslink and collection at the first electrode 25 is possible.

First, in FIG. 6A, in order to start the reset operation of the resistance change element 21 in the low-resistive state of 1 kΩ, it is necessary to set Vgp1 to 1.1 V or higher to be a copper operating area. For example, when Vgp1 is set to 1.3 V, the resistance value increases along the illustrated current mode and becomes high resistance up to about 200 kΩ being a boundary of the copper operating area.

In the current mode, since Vgp1 is high, large current can flow and thus the ionization (initiation) of the metal crosslink at early stage can be promoted. Further, since the potential difference between the first electrode 25 and the second electrode 26 is small, the destruction of the solid electrolyte (resistance change film 24) due to the high electric field is suppressed. On the other hand, the resistance value of the resistance change element 21 remains at about 200 kΩ due to the limitation of the copper operating area.

Next, in FIG. 6B, the resistance change element 21 of which the resistance has increased to about 200 kΩ in the current mode of FIG. 6A becomes a copper operating area even though the current is suppressed by setting Vgp1 to about 0.7 V. The resistance value of the resistance change element 21 increases along the illustrated voltage mode, becomes high resistance up to 1 MΩ being the boundary of the copper operating area or higher, and the reset operation can be completed.

In the voltage mode, large current cannot flow due to the low Vgp1 and therefore, even though the potential difference between the first electrode 25 and the second electrode 26 becomes large, the destruction of the solid electrolyte due to the high electric field is suppressed. In addition, when the potential difference between the first electrode 25 and the second electrode 26 becomes large, the copper operating area expands to the high resistance side, and therefore the resistance value of the resistance change element 21 increases up to 1 MΩ or higher and the desired high-resistive state is achieved.

On the other hand, when the reset operation of the resistance change element 21 being in the low-resistive state with 1 kΩ is performed only in the voltage mode of FIG. 6B, it is necessary to set Vgp1 to 1.1 V or higher to be the copper operating area. For example, it is assumed that Vgp1 is set to 1.3 V and the resistance increases up to 1 MΩ being the limitation of the copper operating area or higher. In this case, during the process of increasing the resistance, large current can flow due to the high Vgp1 and the potential difference between the first electrode 25 and the second electrode 26 is also large, therefore the destruction of the solid electrolyte caused by large current flowing through the high electric field easily occurs. The combination of the current mode in FIG. 6A and the voltage mode in FIG. 6B enables suppressing such destruction of the solid electrolyte caused by large current flowing through a high electric field.

As described above, the combination of the current mode and the voltage mode enables suppressing the destruction of the solid electrolyte. In the combination of the current mode and the voltage mode, it is preferable to perform the current mode first. This is because, in the current mode, large current can flow due to the high Vgp1 and thus the ionization of the metal crosslink at early stage can be promoted. Further, in the combination of the current mode and the voltage mode, it is preferable to perform the voltage mode later. This is because, in the voltage mode, even though Vgp1 is lowered, the resistance can be increased up to 1 MΩ being the limitation of the copper operating area or higher.

In addition, the current mode and the voltage mode may be alternately repeated a plurality of times. This is because, by repeating the current mode and the voltage mode alternately, even though a first reset operation in the current mode and the voltage mode fails to increase the resistance, the resistance can be increased higher by the second and subsequent reset operations. Note that, when the current mode and the voltage mode are alternately repeated, the operation may be completed in the current mode.

Further, the drain voltage Vb1 and the gate voltage Vgp1 may be increased every time the current mode and the voltage mode are alternately repeated. This is because, by increasing the drain voltage Vb1 and the gate voltage Vgp1, even though the first reset operation in the current mode and the voltage mode fails to increase the resistance, the resistance can be increased higher more reliably by the second and subsequent reset operations.

Further, when the current mode and the voltage mode are alternately repeated, the resistance value of the resistance change element 21 may be monitored between the current mode and the voltage mode. By monitoring the resistance value of the resistance change element 21, the current mode and the voltage mode can be alternately repeated until resistance is increased higher. Further, by monitoring the resistance value of the resistance change element 21, unnecessary repetition of the current mode and the voltage mode can be prevented.

Note that FIGS. 6A and 6B describe the case associated with the condition of FIG. 4A, but a similar description is possible also in a case associated with the condition of FIG. 4B. In other words, in the case associated with the condition of FIG. 4B, the source voltage Vp1 of the row selection transistor 22 is set to −2 V and −3 V, and the gate voltage Vgb1 of the bit selection transistor 23 may be used as a parameter.

In the resistance change element 21 of the switch element 2 according to the present example embodiment, the resistance change film 24 is a solid electrolyte material, and oxide, sulfide, an organic material, or the like can be used. For example, an oxide containing such as Al, Ti, Ta, Si, Hf, and Zr, a chalcogenide compound containing such as Ge, As, and TeS, an organic polymer film containing such as carbon, oxygen, and silicon, or the like can be used. Further, a laminated film of these materials may be used. Furthermore, an oxide material to be used for a filament-type resistive random access memory (ReRAM) having an oxygen vacancy, or the like can be used.

The first electrode 25 is an active electrode that supplies a metal ion to the resistance change film 24. For this reason, copper can be used for the first electrode 25. Further, the first electrode 25 may contain copper as a main component, and Ti, Al, Mn, W, Mg, and the like as additives.

The second electrode 26 is an inert electrode that does not supply a metal ion to the resistance change film 24. For this reason, noble metal such as Ru and Pt can be used for the second electrode 26. Alternatively, the second electrode 26 may contain noble metal as a main component, and Ta, Ti, W, and the like.

Figure 7:
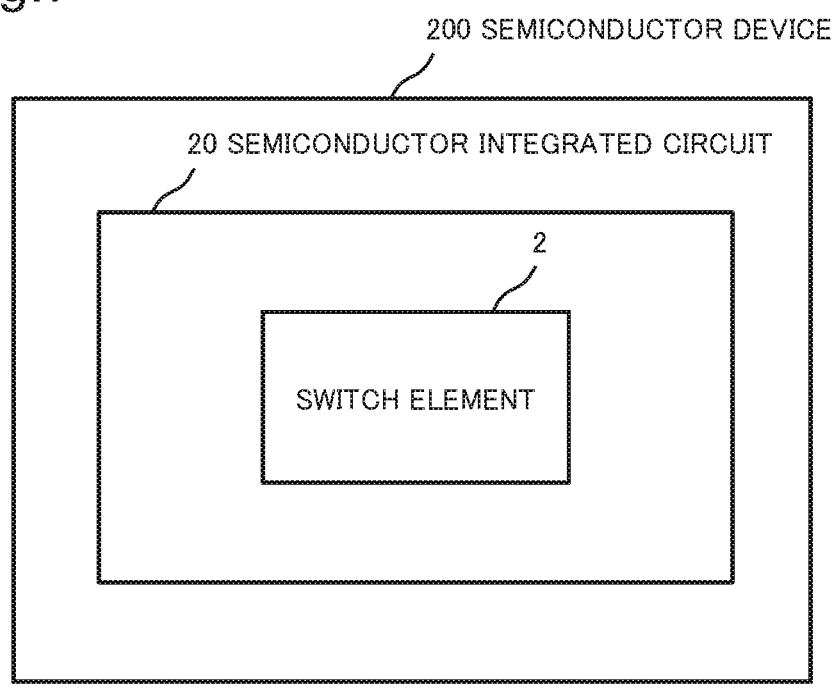
FIG. 7 is a block diagram illustrating a configuration of a semiconductor device according to the second example embodiment of the present invention.

FIG. 7 is a block diagram illustrating a configuration of a semiconductor device 200 according to the present example embodiment. The semiconductor device 200 includes a semiconductor integrated circuit 20, and the semiconductor integrated circuit 20 includes the switch element 2. The semiconductor integrated circuit 20 can include a logic operation circuit, and the switch element 2 can change an operation of the logic operation circuit and a connection of the logic operation circuit. The switch element 2 can be configured as a crossbar switch. The logic operation circuit can be configured with a logic block such as a look up table (LUT), and the like.

The semiconductor integrated circuit 20 includes a multilayer copper interconnect layer formed in an upper layer of a semiconductor substrate, and the resistance change element 21 in the switch element 2 is incorporated in the copper interconnect layer. Further, the row selection transistor 22 and the bit selection transistor 23 of the switch element 2 are formed in the semiconductor substrate. Accordingly, since the resistance change element 21 and the transistor have a hierarchical structure, the area of the semiconductor integrated circuit 20 can be reduced, and the semiconductor device can be downsized. In addition, since the copper interconnect can be also used for the first electrode 25 of the resistance change element 21, the manufacturing process of the semiconductor device is simplified.

The semiconductor device 200 can include the semiconductor integrated circuit 20 such as a memory circuit having a complementary metal oxide semiconductor (CMOS) and a bipolar transistor, a logic operation circuit such as a microprocessor, and a circuit on which these are simultaneously mounted.

In addition, an electronic circuit device, an optical circuit device, a quantum circuit device, a micro machine, micro electro mechanical systems (MEMS), and the like can be connected to the semiconductor device 200, and the switch element 2 according to the present example embodiment can be used as a switch for the connection. Further, the switch element 2 according to the present example embodiment can be used as a non-volatile memory.

Figure 8:
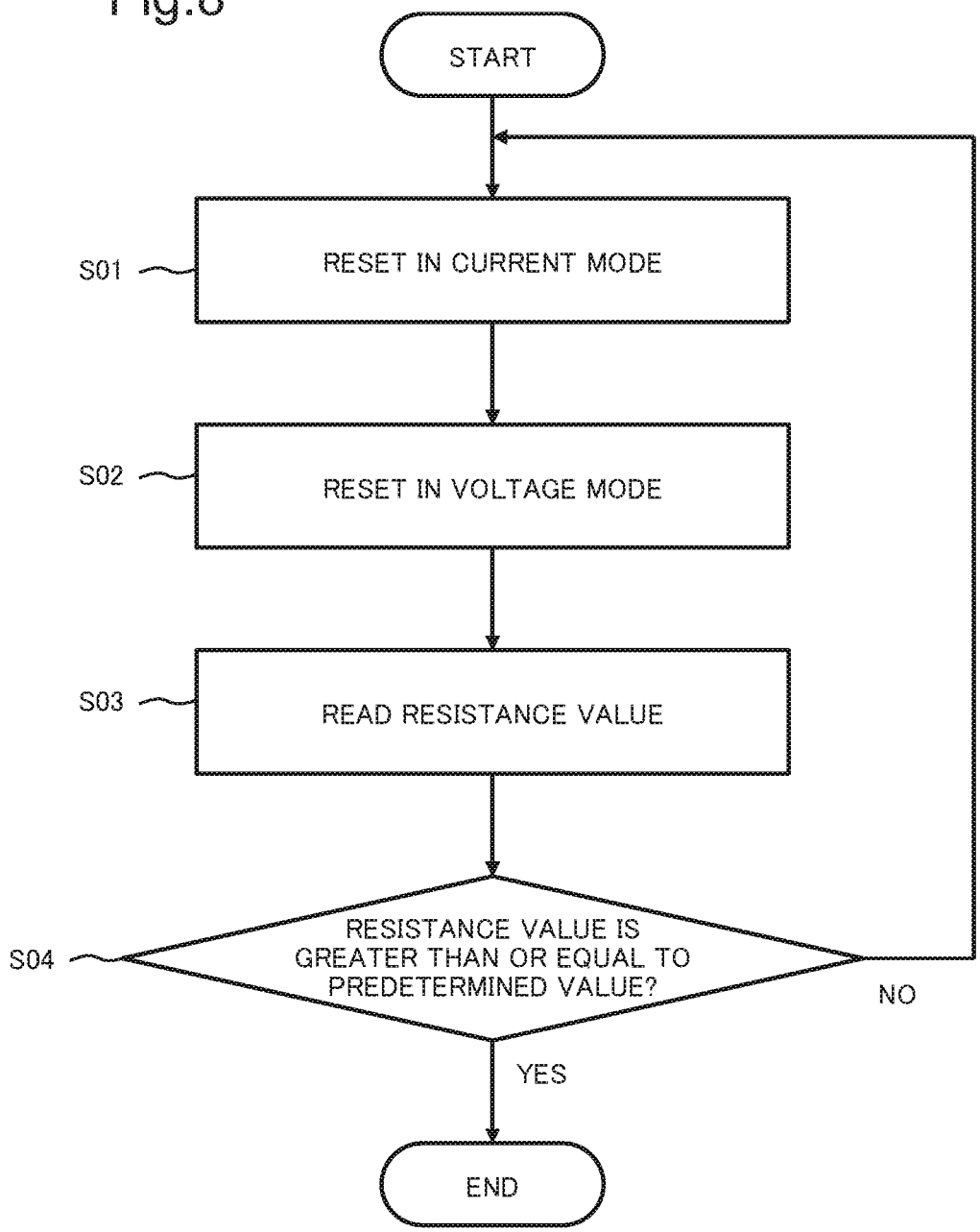
FIG. 8 is a flowchart illustrating the operation of the switch element according to the second example embodiment of the present invention.

FIG. 8 is a flowchart illustrating an operation of a switching method of the switch element 2 according to the present example embodiment. This flowchart starts by starting the reset operation for setting the switch element 2 in the low-resistive state (ON) to the high-resistive state (OFF).

First, in step S01, the switch element 2 is reset in the current mode. The reset in the current mode can be performed in the current mode of FIG. 4A or 4B, or in the current mode of FIG. 6A.

Next, in step S02, the switch element 2 is reset in the voltage mode. The reset in the voltage mode can be performed in the voltage mode of FIG. 4A or 4B, or in the voltage mode of FIG. 6B.

Next, in step S03, the resistance value of the resistance change element 21 in the switch element 2 is read and monitored. When the resistance value of the resistance change element 21 is greater than or equal to a predetermined threshold value (YES in step S04), the flowchart is terminated because predetermined high-resistive state is achieved.

On the other hand, when the resistance value of the resistance change element 21 is less than the threshold value (NO in step S04), step S01 and the subsequent steps are repeated because predetermined high-resistive state is not achieved. At this time, step S01 and the subsequent steps can be repeated until a predetermined high-resistive state is achieved. Further, when an upper limit is set for the number of times of repetition for step S01 and the subsequent steps and the predetermined high-resistive state is not achieved even after repeating the predetermined number of times, the flowchart may be terminated and the resistance change element 21 may be regarded as a defective element.

In addition, when step S01 and the subsequent steps are repeated, for example in the case of the condition of FIG. 4A, the drain voltage Vb1 and the gate voltage Vgp1 may be increased. Further, the resistance value of the resistance change element 21 may be read and monitored between step 1 and step 2.

Figure 9:
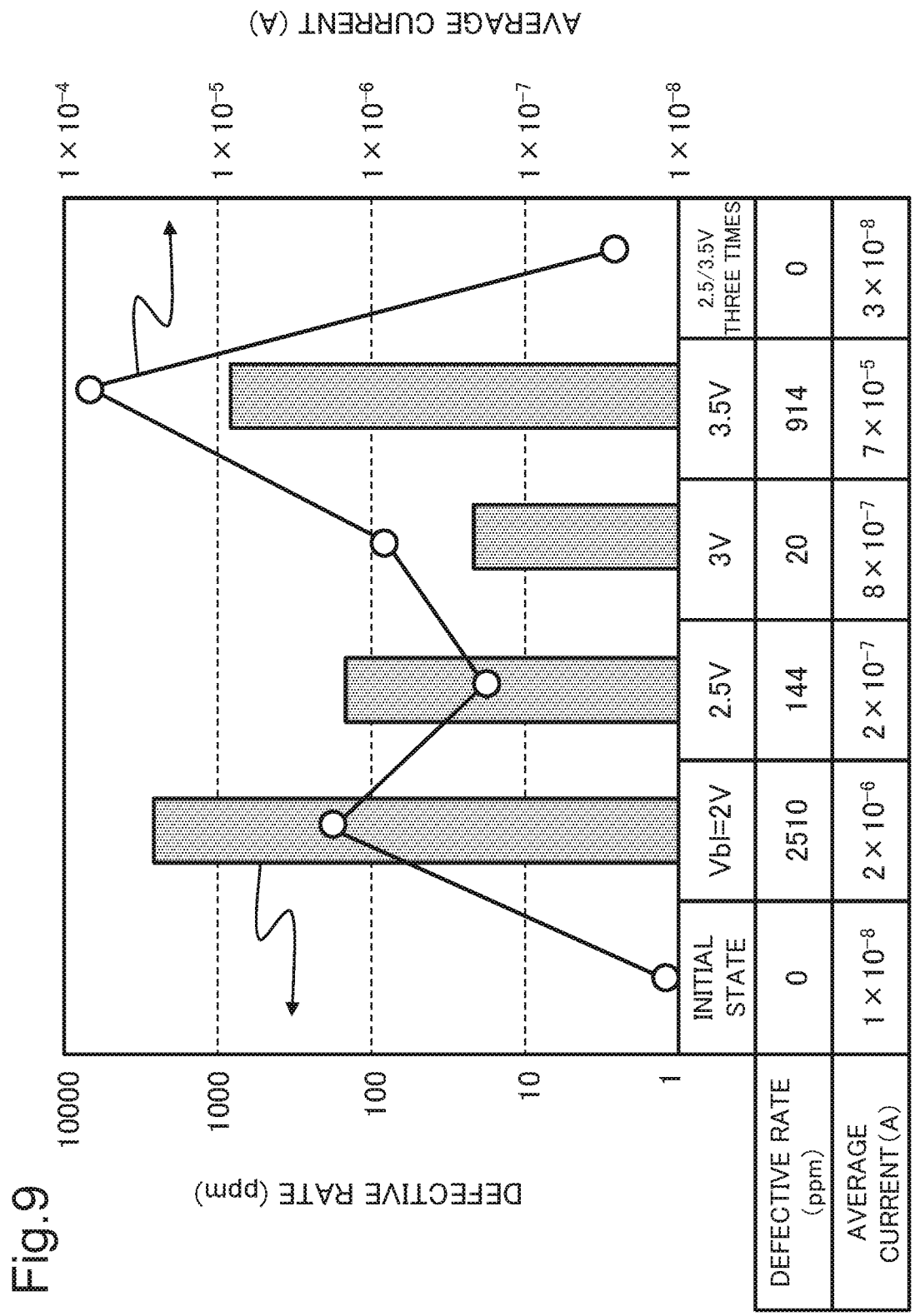
FIG. 9 is a diagram illustrating a comparison result of a defective rate and an average current between a switching method according to the second example embodiment of the present invention and a known switching method.
Figure 10:
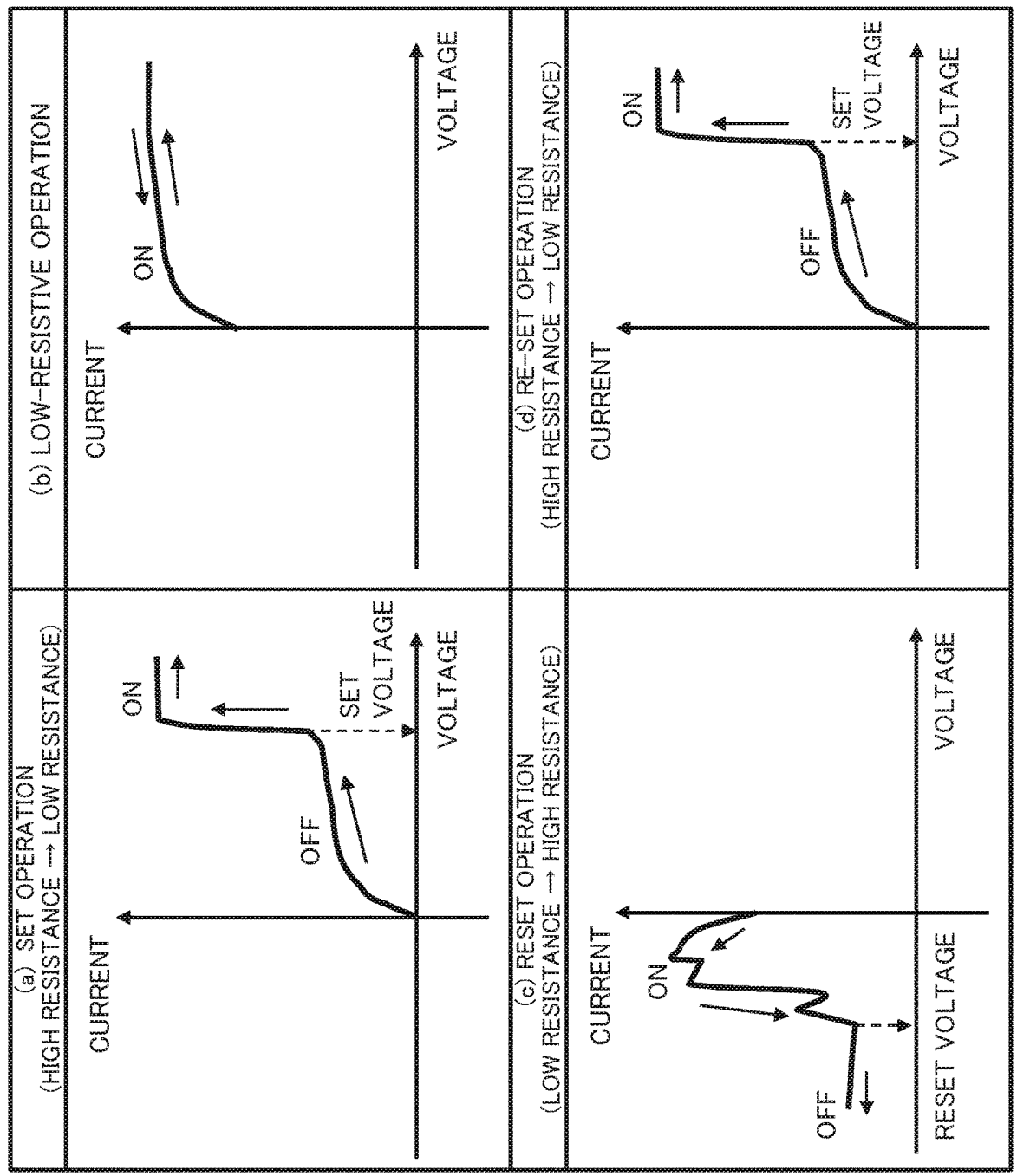
FIG. 10 is a diagram illustrating an operation of resistance change by a known resistance change element.

FIG. 9 is a diagram illustrating a comparison result of a defective rate and an average current in a plurality of the switch elements 2 when the reset operation is performed by the switching method according to the present example embodiment and by a known switching method.

First, in an initial state (high-resistive state) in which the set/reset operation were not performed, the defective rate was 0 ppm and the average current was $1\times10^{-8}$ A.

Next, the set operation was performed to set a low-resistive state, and then the reset operation was performed. In the reset operation by the known switching method, the drain voltage Vb1 of the bit selection transistor 23 was set to 2 V, 2.5 V, 3 V, and 3.5 V and the reset operations were performed in each case. Further, in the reset operation by the switching method according to the present example embodiment, the reset operations of which the current mode and the voltage mode with Vb1 being set to 2.5 V and 3.5 V were repeated three times. The switching method according to the present example embodiment was performed under the condition of FIG. 4A.

When the reset operations by the known switching method were performed, the defective rates decreased to 2,510 ppm, 144 ppm, and 20 ppm as the Vb1 increased to 2 V, 2.5 V, and 3 V, however, the defective rate increased, when the Vb1 increased to 3.5 V, to 914 ppm. In this case, the average current decreased to $2\times10^{-6}$ A and $2\times10^{-7}$ A as the Vb1 increased to 2 V and 2.5 V, however, the average current increased, when the Vb1 increased to 3 V, to $8\times10^{-7}$ A, and the average current further increased, when the Vb1 increased to 3.5 V, to $7\times10^{-5}$ A. When the Vb1 was 3 V, the defective rate decreased with respect to 2.5 V, while the average current increased. This was considered that a sign that both the defective rate and the average current increased significantly at 3.5 V appeared as an increase in the average current at 3 V.

These results of the reset operation by the known switching method were thought to be caused by the defective operation illustrated in FIGS. 5 and 11. In other words, the known switching method was not capable of acquiring values equivalent to the defective rate (0 ppm) and the average current ($1\times10^{-8}$ A) at the initial state.

On the other hand, when the reset operation by the switching method according to the present example embodiment was performed, the defective rate became 0 ppm and the average current became $3\times10^{-8}$ A, which were equivalent to the initial state could be achieved. In other words, it was confirmed that, according to the switching method of the present example embodiment, the transition from the low-resistive state to the high-resistive state was stabilized.

As described above, according to the switch element 2 of the present example embodiment, by combining the current mode and the voltage mode, the current limit and the voltage limit are set in the reset operation, and therefore, the destruction of the resistance change film 24 (solid electrolyte material) caused by large current flowing at the high voltage can be suppressed. Therefore, the occurrence of a defective operation in which a low-resistive state occurs in spite of applying a voltage for reset can be suppressed.

As described above, the present example embodiment is able to provide a switch element that stabilizes transition of a metal crosslink-type resistance change element from a low-resistive state to a high-resistive state.

The whole or part of the example embodiments disclosed above can be described as, but not limited to, the following supplementary notes.

(Supplementary Note 1)

A switch element, including:

a resistance change element including a metal deposition type resistance change film, a first electrode that is connected to one surface of the resistance change film and supplies a metal ion to the resistance change film, and a second electrode that is connected to another surface of the resistance change film;

a first transistor of which a drain or a source is connected to the first electrode; and a second transistor of which a source or a drain is connected to the second electrode, wherein, when switching the resistance change element from a low-resistive state to a high-resistive state by the first transistor and the second transistor making a potential of the second electrode higher than a potential of the first electrode, the switch element switches by having a first mode in which a gate voltage of the first transistor or the second transistor is defined as a first gate voltage, and a potential difference between the first electrode and the second electrode is defined as a first potential difference, and a second mode in which a gate voltage of the first transistor or the second transistor is defined as a second gate voltage, and a potential difference between the first electrode and the second electrode is defined as a second potential difference, and the first gate voltage is set larger than the second gate voltage, and the first potential difference is set smaller than the second potential difference.

(Supplementary Note 2)

The switch element according to supplementary note 1, wherein the first and second potential differences are based on a difference between a potential of a source or a drain of the first transistor and a potential of a drain or a source of the second transistor.

(Supplementary Note 3)

The switch element according to supplementary note 1 or 2, wherein the switch starts in the first mode.

(Supplementary Note 4)

The switch element according to any one of supplementary notes 1 to 3, wherein the first mode and the second mode are alternately repeated.

(Supplementary Note 5)

The switch element according to supplementary note 4, wherein, each time the first mode and the second mode are alternately repeated, the first gate voltage and the second gate voltage, or the first potential difference and the second potential difference are increased.

(Supplementary Note 6)

The switch element according to any one of supplementary notes 1 to 5, wherein a resistance value of the resistance change element is monitored between the first mode and the second mode.

(Supplementary Note 7)

A semiconductor device, including a semiconductor integrated circuit having the switch element according to any one of supplementary notes 1 to 6.

(Supplementary Note 8)

The semiconductor device according to supplementary note 7, wherein
the semiconductor integrated circuit includes an interconnect layer, and the resistance change element of the switch element is provided in the interconnect layer.

(Supplementary Note 9)

A switching method of a switch element including:

a resistance change element having a metal deposition type resistance change film, a first electrode that is connected to one surface of the resistance change film and supplies a metal ion to the resistance change film, and a second electrode that is connected to another surface of the resistance change film;

a first transistor of which a drain or a source is connected to the first electrode; and a second transistor of which a source or a drain is connected to the second electrode, the switching method including:

switching, when switching the resistance change element from a low-resistive state to a high-resistive state by making a potential of the second electrode higher than a potential of the first electrode, by having a first mode in which a gate voltage of the first transistor or the second transistor is defined as a first gate voltage, and a potential difference between the first electrode and the second electrode is defined as a first potential difference, and a second mode in which a gate voltage of the first transistor or the second transistor is defined as a second gate voltage, and a potential difference between the first electrode and the second electrode is defined as a second potential difference; and setting the first gate voltage larger than the second gate voltage and setting the first potential difference smaller than the second potential difference.

(Supplementary Note 10)

The switching method according to supplementary note 9, wherein the first potential difference and the second potential difference are based on a difference between a potential of a source or a drain of the first transistor and a potential of a drain or a source of the second transistor.

(Supplementary Note 11)

The switching method according to supplementary note 9 or 10, wherein the switch starts in the first mode.

(Supplementary Note 12)

The switching method according to any one of supplementary notes 9 to 11, wherein the first mode and the second mode are alternately repeated.

(Supplementary Note 13)

The switching method according to supplementary note 12, wherein, each time the first mode and the second mode are alternately repeated, the first gate voltage and the second gate voltage, or the first potential difference and the second potential difference are increased.

(Supplementary Note 14)

The switching method according to any one of supplementary notes 9 to 13, wherein a resistance value of the resistance change element is monitored between the first mode and the second mode.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2017-133083 filed on Jul. 6, 2017, the disclosure of which is incorporated herein in its entirety by reference.

REFERENCE SIGNS LIST 1, 2 Switch element
11, 21 Resistance change element
12 First transistor
13 Second transistor
14, 24 Resistance change film
15, 25 First electrode
16, 26 Second electrode
22 Row selection transistor
23 Bit selection transistor
20 Semiconductor integrated circuit
200 Semiconductor device

What is claimed is:

1. A switch element, including:

a resistance change element including a metal deposition type resistance change film, a first electrode that is connected to one surface of the resistance change film and supplies a metal ion to the resistance change film, and a second electrode that is connected to another surface of the resistance change film;

a first transistor of which a drain or a source is connected to the first electrode; and a second transistor of which a source or a drain is connected to the second electrode, wherein, when switching the resistance change element from a low-resistive state to a high-resistive state by the first transistor and the second transistor making a potential of the second electrode higher than a potential of the first electrode, the switch element switches by having a first mode in which a gate voltage of the first transistor or the second transistor is defined as a first gate voltage, and a potential difference between the first electrode and the second electrode is defined as a first potential difference, and a second mode in which a gate voltage of the first transistor or the second transistor is defined as a second gate voltage, and a potential difference between the first electrode and the second electrode is defined as a second potential difference, and the first gate voltage is set larger than the second gate voltage, and the first potential difference is set smaller than the second potential difference.

2. The switch element according to claim 1, wherein the first and second potential differences are based on a difference between a potential of a source or a drain of the first transistor and a potential of a drain or a source of the second transistor.

3. The switch element according to claim 1, wherein the switch starts in the first mode.

4. The switch element according to claim 1, wherein the first mode and the second mode are alternately repeated.

5. The switch element according to claim 4, wherein, each time the first mode and the second mode are alternately repeated, the first gate voltage and the second gate voltage, or the first potential difference and the second potential difference are increased.

6. The switch element according to claim 1,
wherein a resistance value of the resistance change element is monitored between the first mode and the second mode.

7. A semiconductor device, including:
a semiconductor integrated circuit having the switch element according to claim 1.

8. The semiconductor device according to claim 7,
wherein the semiconductor integrated circuit includes an interconnect layer, and the resistance change element of the switch element is provided in the interconnect layer.

9. A switching method of a switch element including:
a resistance change element having a metal deposition type resistance change film, a first electrode that is connected to one surface of the resistance change film and supplies a metal ion to the resistance change film, and a second electrode that is connected to another surface of the resistance change film;
a first transistor of which a drain or a source is connected to the first electrode; and
a second transistor of which a source or a drain is connected to the second electrode,
the switching method including:
switching, when switching the resistance change element from a low-resistive state to a high-resistive state by making a potential of the second electrode higher than a potential of the first electrode, by having
 a first mode in which a gate voltage of the first transistor or the second transistor is defined as a first gate voltage, and a potential difference between the first electrode and the second electrode is defined as a first potential difference, and
 a second mode in which a gate voltage of the first transistor or the second transistor is defined as a second gate voltage, and a potential difference between the first electrode and the second electrode is defined as a second potential difference; and
setting the first gate voltage larger than the second gate voltage and setting the first potential difference smaller than the second potential difference.

10. The switching method according to claim 9,
wherein the first potential difference and the second potential difference are based on a difference between a potential of a source or a drain of the first transistor and a potential of a drain or a source of the second transistor.

11. The switching method according to claim 9,
wherein the switch starts in the first mode.

12. The switching method according to claim 9,
wherein the first mode and the second mode are alternately repeated.

13. The switching method according to claim 12,
wherein, each time the first mode and the second mode are alternately repeated, the first gate voltage and the second gate voltage, or the first potential difference and the second potential difference are increased.

14. The switching method according to claim 9,
wherein a resistance value of the resistance change element is monitored between the first mode and the second mode.

15. The switch element according to claim 2,
wherein the switch starts in the first mode.

16. The switch element according to claim 2,
wherein the first mode and the second mode are alternately repeated.

17. The switch element according to claim 3,
wherein the first mode and the second mode are alternately repeated.

18. The switch element according to claim 2,
wherein a resistance value of the resistance change element is monitored between the first mode and the second mode.

19. The switch element according to claim 3,
wherein a resistance value of the resistance change element is monitored between the first mode and the second mode.

20. The switch element according to claim 4
wherein a resistance value of the resistance change element is monitored between the first mode and the second mode.

* * * * *